April 24, 1962 L. PESSEL 3,031,516

METHOD AND MATERIALS FOR OBTAINING LOW-RESISTANCE BONDS TO THERMOELECTRIC BODIES

Filed March 8, 1961

INVENTOR.
LEOPOLD PESSEL
BY W.S. Hill
AGENT

United States Patent Office 3,031,516
Patented Apr. 24, 1962

3,031,516

METHOD AND MATERIALS FOR OBTAINING LOW-RESISTANCE BONDS TO THERMOELECTRIC BODIES

Leopold Pessel, Wyndmoor, Pa., assignor to Radio Corporation of America, a corporation of Delaware Filed Mar. 8, 1961, Ser. No. 94,260
17 Claims. (Cl. 136—5)

Figure 1:
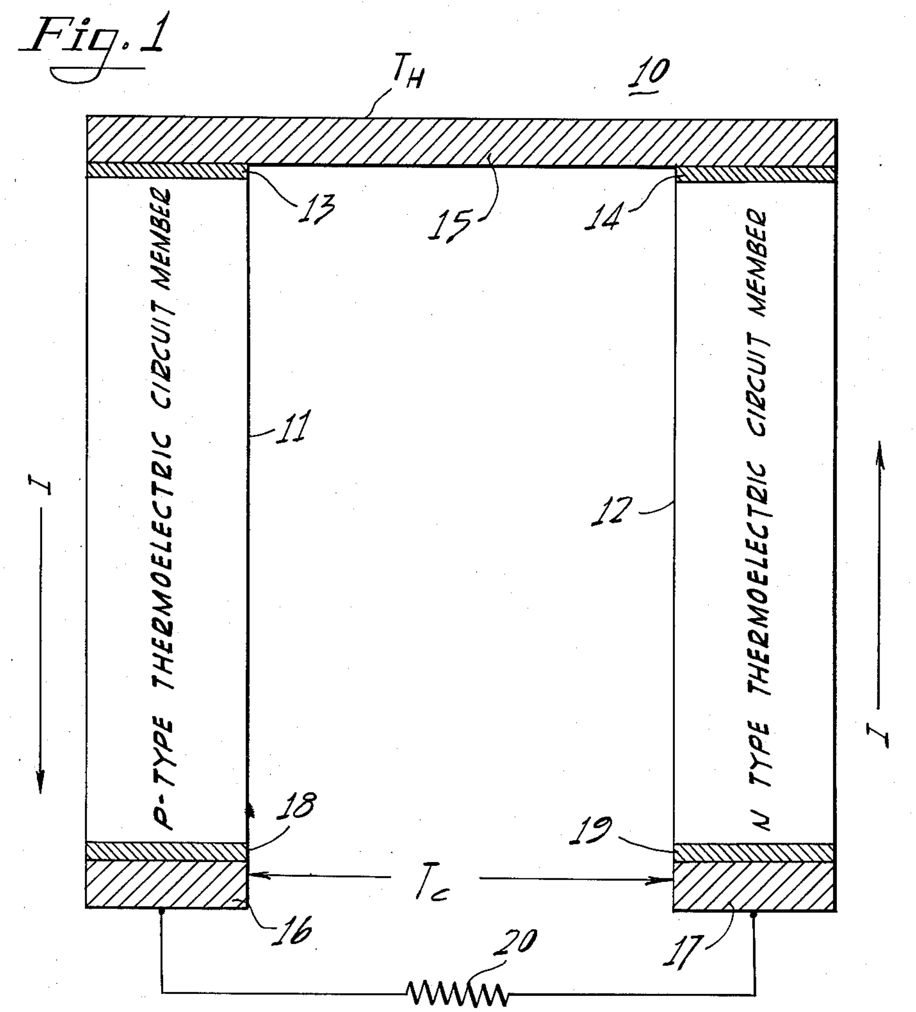

This invention relates to improved thermoelectric devices and to improved methods of fabricating such devices. More particularly, the invention relates to improved materials and methods for obtaiinng mechanically strong, low-resistance contacts to thermoelectric bodies.

Thermoelectric components or circuit members are made of bodies of thermoelectric materials such as bismuth telluride, lead telluride, antimony telluride, germanium telluride, silver indium telluride, silver gallium telluride, copper gallium telluride, silver antimony telluride, and the like. Similar compounds of selenium, for example silver antimony selenide, and of sulfur, for example the rare earth sulfides, are also useful in thermoelectric devices. Such compounds containing at least one member of the group consisting of sulfur, selenium and tellurium are generally known as chalcogenides. While the pure compounds may be utilized, thermoelectric compositions usually consist of alloys or solid solutions of more than one compound. Small amounts of various additives or doping agents may be incorporated in the thermoelectric composition to modify the conductivity type of the material.

Thermoelectric devices which convert heat energy directly into electrical energy by means of the Seebeck effect generally comprise two thermoelectric circuit members or components bonded to a block of metal, which may, for example, be copper, to form a thermoelectric junction. The two members are of thermoelectrically complementary types, that is, one member is made of P-type thermoelectric material and the other of N-type thermoelectric material. Whether a particular thermoelectric material is designated N-type or P-type depends upon the direction of current flow across the cold junction of a thermocouple formed by the thermoelectric material in question and a metal such as copper or lead, when the thermocouple is operating as a thermoelectric generator according to the Seebeck effect. If the current in the external circuit flows from the thermoelectric material, then the material is designated as "P-type"; if the current in the external circuit flows toward the thermoelectric material, then the material is designated as "N-type." The present invention relates to both P-type and N-type thermoelectric materials. Preferably these materials contain at least 5 weight percent of at least one member of the group consisting of sulfur, selenium, and tellurium.

A good thermoelectric material should have a low electrical resistivity, since the Seebeck EMF generated in energy converters of this type is dependent upon the temperature difference between the hot and cold junctions. The generation of Joulean heat in the thermoelectric device due to the electrical resistance of either the thermoelectric members, or the auxiliary components, or the electrical contacts to the two members, will reduce the efficiency of the device.

Thermoelectric devices which utilize electrical energy for environmental cooling and refrigeration by means of the Peltier effect also include two thermoelectrically complementary circuit members bonded to a block of metal.

In these devices, a typical thermoelectric junction uses 30 amperes at 0.1 volt. Accordingly, if any high resistance contacts are present, considerable Joulean heat will be dissipated, and the efficiency of the device will be decreased. The presence of high resistance contacts on the thermoelectric circuit members has been a serious problem in the fabrication of both Seebeck and Peltier thermoelectric devices. High resistance contacts have reduced the cooling produced by Peltier devices as much as 40% below the theoretical maximum value. A contact resistance of only ¼ of the sum of the resistance of the two circuit members in a Peltier device can reduce the amount of Peltier cooling by as much as 25%. For a more complete discussion of the effect of contact resistance on maximum cooling obtained in Peltier devices, see FIG. 5 of chapter 8, "Evaluation and Properties of Materials for Thermoelectric Applications," by F. D. Rosi and E. G. Ramberg, in "Thermoelectricity," edited by P. H. Egli, John Wiley and Sons, Inc., New York, 1960.

It is therefore an object of the instant invention to provide improved methods and materials for making low resistance electrical contacts to thermoelectric circuit members.

Another object of the invention is to provide improved methods and materials for obtaining low resistance, mechanically strong electrical connections to thermoelectric components.

A further object of the invention is to provide improved methods and materials for obtaining low resistance, mechanically strong electrical bonds between a metal body and a thermoelectric circuit member.

Still another object of the invention is to provide improved electrical connections to thermoelectric components in thermoelectric devices.

These and other objects and advantages of the instant invention are accomplished by applying to a surface of a thermoelectric body comprising at least one member of the group consisting of sulfur, selenium and tellurium a solder consisting essentially of bismuth and at least 2 weight percent of at least one element selected from the group consisting of silver and gold. The thermoelectric body is fluxed, and then tinned with the solder at a temperature above the melting point of the solder. Advantageously, the molten solder is maintained at a temperature within the range 275° C. to 350° C. The metal body to be joined to the thermoelectric body or circuit member is also fluxed. The tinned surface of the thermoelectric circuit member and the fluxed surface of the metal body are pressed together, and the assemblage is heated to a temperature above the melting point of the solder. Suitably, the assemblage is heated to a temperature from 5° to 100° C. above the melting point of the solder. The assemblage of the thermoelectric component and the metal body is then cooled to room temperature.

Figure 2:
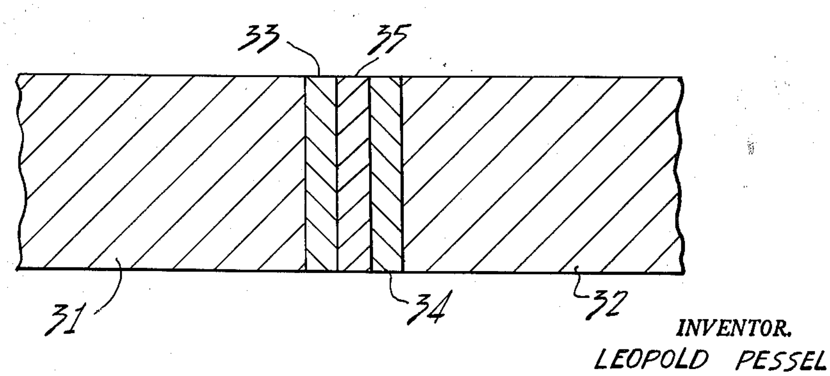

The invention will be described in greater detail by the following examples, in conjunction with the accompanying drawing, in which:

FIGURE 1 is a cross-sectional view of a thermoelectric device comprising two thermoelectrically complementary circuit members bonded to a metal block in accordance with a first embodiment of the invention; and, FIGURE 2 is a cross-sectional view of a thermoelectric body bonded to another body in accordance with a second embodiment of the invention.

Referring now to FIGURE 1, the thermoelectric device 10 comprises a thermoelectric component 11, which may, as illustrated, be P-type, and a complementary type thermoelectric circuit member 12, which in this example is N-type, as illustrated in the drawing. Each circuit member comprises at least 5 weight percent of at least one member of the group consisting of sulfur, selenium and tellurium. It will be understood that the conductivity types of circuit members 11 and 12 may be reversed. One end of component or circuit member 11 is bonded to an electrical contact 16, and one end of circuit member 12 is similarly bonded to an electrical contact 17. Advantageously, contacts 16 and 17 are blocks of metal such as copper or the like. The bonds between thermoelectric circuit members 11 and 12 and the respective contacts 16 and 17 consist of solder layers 18 and 19 respectively. The other ends of the thermoelectric circuit members 11 and 12 are bonded to an intermediate member 15, in the form of a buss bar or plate. Member 15 is made of a material which is thermally and electrically conductive, and has negligible thermoelectric power. Bodies of metal or metallic alloys are suitable for this purpose. In this example, intermediate member 15 consists of a copper plate. The bond between thermoelectric circuit members 11 and 12 and the metal plate 15 consists of solder layers 13 and 14 respectively. In accordance with this invention, the low-resistance solder layers 13, 14, 18 and 19 consist of an alloy of bismuth and at least 2 weight percent of at least one element selected from the group consisting of gold and silver. When a bismuth-silver alloy is used, the preferred composition range is 2 to 10 weight percent silver, balance bismuth. When a bismuth-gold alloy is utilized, the preferred composition range is 2 to 18 weight percent gold, balance bismuth. Ternary alloys consisting of bismuth and up to 10 weight percent of a mixture of silver and gold may also be utilized as the low-resistance solder in accordance with this invention.

In the operation of the thermoelectric device 10, the metal plate 15 (and its junctions to the thermoelectric members 11 and 12) are heated to a temperature $T_H$ and become the hot junction of the device. The metal contacts 16 and 17 on thermoelements 11 and 12, respectively, are maintained at a temperature $T_C$ which is lower than the temperature ($T_H$) of the hot junction of the device. The lower or cold junction temperature ($T_C$) may, for example, be room temperature. A temperature gradient is thus established in each circuit member 11 and 12, from a high temperature adjacent plate 15 to a low temperature adjacent contacts 16 and 17, respectively. The electromotive force developed under these conditions produces in the external circuit a flow of conventional current (I) in the direction shown by arrows in FIGURE 1; that is, the current flows in the external circuit from the P-type thermoelement 11 toward the N-type thermoelement 12. The device is utilized by connecting a load, shown as a resistance 20 in the drawing, between the contacts 16 and 17 of thermoelements 11 and 12, respectively.

*Example I*

The P-type thermoelectric circuit member 11 may, for example, consist of bismuth telluride and 5 to 70 mol percent antimony telluride alloyed with up to 2 weight percent of one or more of the oxides of copper, silver, gold, and mercury, as described in U.S. Patent 2,953,616, issued September 20, 1960 to L. Pessel and T. Q. Dziemianowicz, and assigned to the same assignee as that of the instant application. The N-type thermo-electric circuit member 12 may for example consist of bismuth telluride containing .10 to .50 weight percent bismuth, .27 to .80 weight percent antimony, and .13 to .40 weight percent copper, as described in U.S. Patent 2,951,105, issued to C. J. Busanovich on August 30, 1960 and assigned to the assignee of the instant application.

A mechanically strong low-resistance electrical bond between the P-type circuit member 11 and the metal contact block 16 is attained according to the invention as follows. The surface of the thermoelectric circuit member to be bonded is first advantageously fluxed. Suitable fluxes for this purpose are saturated solutions of lithium chloride or zinc chloride in methanol. Other fluxes may also be utilized. In this example, the flux utilized has the following composition:

| | | |
|---|---|---|
| Zinc chloride | grams | 95 |
| Ammonium chloride | do | 10 |
| Stannous chloride | do | 6 |
| Concentrated hydrochloric acid | ml | 150 |
| Water | ml | 150 |

Next, the fluxed surface of the thermoelectric body 11 is "tinned" with a molten solder consisting of 2 to 18 weight percent gold and 98 to 82 weight percent bismuth. The eutectic of the gold-bismuth solder has the composition 18 weight percent gold-82 weight percent bismuth, and melts at 240° C. The alloy having the greatest mechanical strength for bonding to thermoelectric circuit members which comprise at least one member of the group consisting of sulfur, selenium and tellurium has the composition 10 weight percent gold-90 weight percent bismuth, and melts at about 250° C. In this example, the specific composition utilized consists of 10 weight percent gold and 90 weight percent bismuth, which has been found particularly advantageous. However, any bismuth-gold solder containing 2 to 18 weight percent gold has been found satisfactory for this purpose. Compositions containing bismuth and 18 to 30 weight percent gold may also be utilized as solders, although they require rather high bath temperatures.

It has been found convenient in practicing the invention to apply the flux by brushing the thermoelectric component, then dipping the fluxed end of the thermoelectric component into a pot of molten solder. The temperature of the molten solder in this example is preferably kept within the range of 275° C. to 350° C.

The next operation is to flux the metal contact block 16 to which the thermoelectric component 11 is to be joined. If desired, after the metal contact 16 is fluxed, it may be tinned with any convenient solder. It will be understood that, in practice, the step of fluxing and tinning the metal contact block 16 may be performed simultaneously with the fluxing and tinning of the circuit member 11, so that the final step of bonding these two bodies may be performed wtihout delay. The metal block 16 may be fluxed with the same fluxes employed for the thermoelectric component 11. Alternatively, other fluxes may be utilized. In this example, since the metal block 16 consists of copper, the known copper fluxes such as zinc chloride and ammonium chloride may be utilized for this purpose. The metal block 16, after fluxing, may be tinned with the same molten 90 weight percent bismuth-10 weight percent gold solder described above. Alternatively, any of the known solders for copper, such as 60 weight percent tin-40 weight percent lead, or pure tin, or tin and up to 10 weight percent antimony, may be utilized for tinning the copper contact block 16.

In this example, the fluxed copper block 16 is tinned with the same 90 weight percent bismuth-10 weight percent gold solder used to tin the thermoelectric component 11. This solder is kept molten in an iron pot which is maintained at about 320° C. by means of an electric hot plate. The tinned surface of the thermoelectric component 11 is pressed into close contact with the tinned surface of copper block 16. The exact pressure between the thermoelectric component and the metal block is not critical in the practice of the invention, since a light pressure of a few grams per cm.$^2$ is sufficient to wring out any excess solder between the two bodies and leave a layer 18 of the solder between them. The assemblage of the thermoelectric component 11 and the metal block 16 is then heated to a temperature above the melting point of the solder. Conveniently, the assemblage is heated to a temperature in the range 300° to 320° C.

The assemblage is then cooled, for example, by means of an air blast, so that solder layer 18 solidifies and bonds thermoelectric component 11 to metal block 16. The bonded assemblage is then scrubbed in running tap water to remove flux residues.

On testing bonds made by the method described above, it was found that they exhibited an average shear strength about 70 to 80 percent greater than the bonds made by the prior art soft solder method. Furthermore, the appearance of the fractures indicated that there was no longer any separation of the solder layer from the thermoelectric circuit member. Instead, it appeared that fracture was now occurring within the solder layer 18 itself. In addition, photomicrographs of the bonding between such solder layers according to the invention and a tellurium-containing thermoelectric component have shown that there may be substitutional alloying or compound formation between the solder layer and the component. This may account for the greater strength of bonds made according to the instant invention. However, it will be understood that the practice of the invention is not dependent upon any particular explanation for the superior results obtained.

It will be understood that in practice both ends of the thermoelectric component 11 may be simultaneously fluxed, next tinned, and then bonded to both metal block 16 and metal plate 15 in a single step. The thermoelectric circuit member 12 may be similarly bonded to metal block 17 and metal plate 15. If desired, both thermoelectric components 11 and 12 may be simultaneously bonded between metal plate 15 and metal contacts 16 and 17 respectively.

*Example II*

According to another embodiment of the invention, a mechanically strong, low electrical resistance bond between a metal block and a thermoelectric component comprising at least one member of the group consisting of sulfur, selenium and tellurium is obtained in a manner similar to that described in Example I, but utilizing a solder consisting of 2 to 10 weight percent silver, balance bismuth. The eutectic of this binary alloy has the composition 5 weight percent silver-95 weight percent bismuth. In this example, the thermoelectric device 10 comprises a P-type circuit member 11 which consists of 55 to 65 mol percent tellurium, 17–32 mol percent bismuch, 8–23 mol percent antimony, up to 0.56 weight percent of at least one element from the group consisting of silver, mercury and gold, and up to 1.7 weight percent of at least one element selected from the group consisting of selenium and sulfur, as described in U.S. Patent 2,762,857 issued to N. Lindenblad on September 11, 1956 and assigned to the assignee of the instant invention. The N-type circuit member 12 may consist, for example, of 95 to 60 mol percent bismuth telluride and 5 to 40 mol percent bismuth selenide, with .13 to .34 weight percent copper sulfide or silver sulfide, as described in U.S. Patent 2,902,528, issued to F. D. Rosi on September 1, 1959 and assigned to the assignee of the instant application. The specific silver-bismuth alloy utilized in this example is the hypereutectic composition consisting of 7 weight percent silver-93 weight percent bismuth. While any of the silver-bismuth solders containing 2 to 10 weight percent silver have been found satisfactory, the above hypereutectic alloy containing 7 weight percent silver has been found particularly advantageous. The thermoelectric circuit members 11 and 12 may be fluxed with any of the fluxes mentioned above prior to the step of tinning them with the molten 7 weight percent silver-93 weight percent bismuth solder. Monofluorophosphoric acid has also been found suitable as a flux. The bismuth-silver solder is kept molten by maintaining it at a temperature between 275° and 350° C. In this example, the solder is kept molten in an iron pot maintained at about 320° C. on a hot plate. The circuit members 11 and 12 are bonded to metal blocks 16 and 17 respectively and to metal plate 15 in the same manner as described above in Example I. Bonds made in accordance with this embodiment of the invention between a thermoelectric component and a copper block have been found to exhibit a shear strength about 70% greater than the soft solder bonds of the prior art.

The gold-bismuth solders of the invention are easy to maintain clean and free from dross in the molten state. The coating left by gold-bismuth solders on a tellurium-containing thermoelectric body tends to be smooth and easy to solder. The silver-bismuth solders of the invention are less expensive than the gold-bismuth solders, yet produce bonds which have comparable increased mechanical strength.

*Example III*

According to another embodiment of the invention, a mechanically strong, low electrical resistance bond is made between a metal body and a thermoelectric component comprising at least one member of the group consisting of sulfur, selenium and tellurium in a manner similar to that described in Example I, but utilizing a solder consisting of 1 to 5 weight percent silver, 1 to 5 weight percent gold, and 98 to 90 weight percent bismuth. In this example, the thermoelectric device 10 comprises a P-type thermoelectric circuit member 11 which may consist, for example, of silver antimony telluride or of any of the P-type thermoelectric compositions mentioned above. Alternatively, the P-type circuit member 11 may consist of silver antimony selenide. The N-type thermoelectric circuit member 12 may consist, for example, of 95 to 30 mol percent bismuth telluride and 5 to 70 mol percent antimony telluride with .01 to 1.0 weight percent of a halide of bismuth or antimony, as described in U.S. Patent 2,957,937, issued to R. V. Jensen and F. D. Rosi on October 25, 1960, and assigned to the assignee of the instant application. The specific solder utilized in this example consists of 1 weight percent silver-1 weight percent gold-98 weight percent bismuth. The fluxes used with this solder may be the same as those described in Examples I and II.

*Example IV*

It will be understood that the embodiments described above are by way of example only, and not limitation. Various modifications and variations may be made without departing from the spirit and scope of the instant invention. For example, a "duplex" soldering process employing two successive solder layers may be utilized to form a mechanically strong low-resistance electrical connection between a thermoelectric body (comprising at least one member of the group consisting of sulfur, selenium and tellurium) and another body, in the following manner. Referring now to FIGURE 2, the thermoelectric body 31 may, for example, consist of any of the P-type or N-type thermoelectric compositions mentioned above. In this example, the thermoelectric body 31 consists of N-type bismuth telluride containing up to 1.64 weight percent of at least 1 member of the group copper sulfide, silver sulfide, copper selenide and silver selenide, as described in U.S. Patent 2,902,529, issued to C. J. Busanovich on September 1, 1959 and assigned to the assignee of the instant application. Alternatively, the thermoelectric body 31 may consist of silver antimony sulfide, or of a sulfide of one of the rare earth elements, such as cerium sulfide.

First, at least a portion of the surface of the thermoelectric body 31 is tinned with a first solder 33 consisting essentially of bismuth and at least 2 weight percent of at least 1 element selected from the group consisting of silver and gold. The thermoelectric body 31 is then allowed to cool, so as to solidify a coating of the aforesaid first solder 33 on a portion of the surface of the thermoelectric body. This solder-coated surface of the thermoelectric body is then tinned with a second solder 35 which has a melting point substantially lower than the first solder. The second solder 35 may for example consist of lead-tin or tin-bismuth alloys. The second solder 35 is applied at a temperature which is too low to melt the previously applied coating of the first solder. A portion of the other body 32 is then tinned with a third solder 34. However, if desired, the solder 34 applied to the other body 32 may have the same composition as the second solder 35. The tinned surfaces of the thermoelectric body 31 and the other body 32 are then contacted while maintaining the temperature of the two bodies above the melting point of the second and third solder layers 34 and 35 but below the melting point of the first solder layer 33. The assemblage of the two bodies and the intermediate solder layers is then cooled to room temperature. In this method, the first solder layer 33, which consists of bismuth-gold or bismuth-silver, forms a strong bond to the thermoelectric body 31. The first solder layer 33 also provides a surface which forms a strong bond with the layer 35 of the second and lower-melting solder, which in turn forms a strong bond with the layer 34 of solder on the other body 32. This arrangement is advantageous where the first solder layer 33 does not form a strong bond to the other body 32.

The other body 32 may consist of a metal block, for example copper, but is not restricted thereto. The method of the invention may also be utilized to join a thermoelectric body to a non-metallic body, for example to another thermoelectric element or to a metallized ceramic body. Increased efficiency in the conversion of thermal energy to electrical energy may be attained by bonding two thermoelectric bodies in this manner so as to form a single thermoelectric circuit member, provided that the portion of the circuit member adjacent the hot junction is made of thermoelectric material having a higher energy gap than that portion of the circuit member which is adjacent the cold junction.

What is claimed is:

1. In the method of providing a low-resistance electrical contact between a thermoelectric body comprising at least one member of the group consisting of sulfur, selenium, and tellurium, and another body, the process comprising tinning at least a portion of said thermoelectric body with a molten alloy consisting essentially of bismuth and at least one element selected from the group consisting of gold and silver, in gold-bismuth alloys the amount of gold being 2–18 weight percent, in silver-bismuth alloys the amount of silver being 2–10 weight percent, in gold-silver-bismuth alloys the amount of gold and silver combined being 2–10 weight percent, and then contacting said tinned surface to said other body while maintaining said bodies at a temperature above the melting point of said solder.

2. The method according to claim 1, wherein said alloy consists of 2 to 18 weight percent gold, balance bismuth.

3. The method according to claim 1, wherein said alloy consists of 2 to 10 weight percent silver, balance bismuth.

4. The method according to claim 2, wherein said alloy consists of 10 weight percent gold and 90 weight percent bismuth.

5. The method according to claim 3, wherein said alloy consists of 7 weight percent silver and 93 weight percent bismuth.

6. The method of soldering a metal body to a thermoelectric body comprising at least one member of the group consisting of sulfur, selenium and tellurium so as to achieve a low electrical resistance bond therebetween, comprising the steps of tinning at least a portion of the surface of said thermoelectric body with a solder consisting essentially of bismuth and of at least one element selected from the group consisting of silver and gold, in gold-bismuth solders the amount of gold being 2–18 weight percent, in silver bismuth solders the amount of silver being 2–10 weight percent, in gold-silver-bismuth solders the amount of gold and silver combined being 2–10 weight percent; tinning at least a portion of the surface of said metal body with solder; contacting said tinned surfaces of said bodies while maintaining the temperature of said bodies above the melting point of said solders; and cooling said bodies.

7. The method according to claim 6, wherein said solder consists of 2 to 18 weight percent gold, balance bismuth.

8. The method according to claim 6, wherein said solder consists of 10 weight percent gold and 90 weight percent bismuth.

9. The method according to claim 6, wherein said solder consists of 2 to 10 weight percent silver, balance bismuth.

10. The method according to claim 6, wherein said solder consists of 7 weight percent silver and 93 weight percent bismuth.

11. In a thermoelectric device, a metal body and a thermoelectric circuit member comprising at least one member of the group consisting of sulfur, selenium and tellurium bonded by a solder consisting essentially of at least one element selected from the group consisting of gold and silver, balance bismuth, in gold-bismuth solders the amount of gold being 2–18 weight percent, in silver-bismuth solders the amount of silver being 2–10 weight percent, and in gold-silver-bismuth solders the amount of gold and silver combined being 2–10 weight percent.

12. A thermoelectric device including a body of thermoelectric material comprising at least one member of the group consisting of sulfur, selenium and tellurium, and having another body bonded thereto, the bond between said bodies comprising a solder layer consisting essentially of at least one element selected from the group consisting of gold and silver, balance bismuth, in gold-bismuth solders the amount of gold being 2–18 weight percent, in silver-bismuth solders the amount of silver being 2–10 weight percent, and in gold-silver-bismuth solders the amount of gold and silver combined being 2–10 weight percent.

13. A thermoelectric device including a body of thermoelectric material comprising at least one member of the group consisting of sulfur, selenium and tellurium, and having another body bonded thereto, the bond between said bodies comprising a solder layer consisting essentially of 10 weight percent gold and 90 weight percent bismuth.

14. A thermoelectric device including a body of thermoelectric material comprising at least one member of the group consisting of sulfur, selenium and tellurium, and having another body bonded thereto, the bond between said bodies comprising a solder layer consisting essentially of 2 to 10 weight percent silver, balance bismuth.

15. A thermoelectric device including a body of thermoelectric material comprising at least one member of the group consisting of sulfur, selenium and tellurium, and having another body bonded thereto, the bond between said bodies comprising a solder layer consisting essentially of 7 weight percent silver and 93 weight percent bismuth.

16. A thermoelectric device including a body of thermoelectric material comprising at least one member of the group consisting of sulfur, selenium and tellurium, and having another body bonded thereto, the bond between said bodies comprising a solder layer consisting essentially of 1 to 5 weight percent silver, 1 to 5 weight percent gold, and 98 to 90 weight percent bismuth.

17. The method of soldering a metal body to a thermoelectric body comprising at least one member of the group consisting of sulfur, selenium and tellurium so as to achieve a low-resistance electrical connection therebetween, comprising the steps of tinning at least a portion of the surface of said thermoelectric body with a first solder consisting essentially of bismuth and at least one element selected from the group consisting of silver and gold, in gold-bismuth solders the amount of gold being 2–18 weight percent, in silver-bismuth solders the amount of silver being 2–10 weight percent, and in gold-silver-bismuth solders the amount of gold and silver combined being 2–10 weight percent; allowing said thermoelectric body to cool so as to solidify a coating of said first solder on said body; tinning said solder coated portion of said thermoelectric body with a second solder, said second solder having a melting point substantially lower than said first solder; tinning at least a portion of the surface of said metal body with a third solder; contacting said tinned surfaces of said bodies while maintaining the temperature of said bodies above the melting point of said second and third solders; and cooling said bodies.

References Cited in the file of this patent

UNITED STATES PATENTS 2,877,283 Justi ------------------ Mar. 10, 1959